United States Patent [19]

Shima et al.

[11] Patent Number: 5,638,391
[45] Date of Patent: Jun. 10, 1997

[54] SEMICONDUCTOR LASER DEVICE AND OPTICAL DISC APPARATUS PROVIDED WITH THE SEMICLONDUCTOR LASER DEVICE

[75] Inventors: Akihiro Shima; Yoriko Tanigami; Toshitaka Aoyagi, all of Tokyo, Japan

[73] Assignee: Mitsubishi Denki Kabushiki Kaisha, Tokyo, Japan

[21] Appl. No.: 574,308

[22] Filed: Dec. 18, 1995

[30] Foreign Application Priority Data

Dec. 21, 1994 [JP] Japan ................... 6-318359

[51] Int. Cl.⁶ ................ H01S 3/19; H01S 3/04
[52] U.S. Cl. ................ 372/44; 372/36
[58] Field of Search ............... 372/36, 44, 50; 257/88

[56] References Cited

U.S. PATENT DOCUMENTS 5,086,431   2/1992   Hardy, Jr. et al. ............ 372/36

FOREIGN PATENT DOCUMENTS

| 56-27988 | 3/1981 | Japan | 372/36 |
|---|---|---|---|
| 63-292688 | 11/1988 | Japan . | |
| 64-25589 | 1/1989 | Japan . | |
| 06283807 | 10/1994 | Japan . | |

OTHER PUBLICATIONS

Kato et al., "Hybrid Laser Array With Closely Spaced Dual Beams", 35th Applied Physics of Japan and Related Societies Meeting, 1988, pp. 898 and 30p-ZO-3 (no month).

*Primary Examiner*—Rodney B. Bovernick
*Assistant Examiner*—Luong-Quyen T. Phan
*Attorney, Agent, or Firm*—Leydig, Voit & Mayer

[57] ABSTRACT

A semiconductor laser device includes: a substrate serving as a heat sink; a thermal buffer plate disposed on the surface of the substrate; a first semiconductor laser chip having first and second main surfaces and including a first light emitting point in the vicinity of the first main surface, the first semiconductor laser chip being disposed on the surface of the thermal buffer plate at the second main surface; spaced apart thermal conductors disposed on the first main surface of the first semiconductor laser chip spaced from the first light emitting point with the first light emitting point between them; a second semiconductor laser chip having third and fourth main surfaces and including a second light emitting point in the vicinity of the third main surface, the second semiconductor laser chip being disposed on the thermal conductors at the third main surface so that the light radiation direction of the second semiconductor laser chip is parallel to the light radiation direction of the first semiconductor laser chip, wherein the second light emitting point is opposed to and close to the first emitting point. Even when the environmental temperature changes, the expansion and contraction of the interval between the light emitting points is smaller than in prior art structures.

15 Claims, 9 Drawing Sheets

SEMICONDUCTOR LASER DEVICE AND OPTICAL DISC APPARATUS PROVIDED WITH THE SEMICLONDUCTOR LASER DEVICE

FIELD OF THE INVENTION

The present invention relates to a semiconductor laser device that has less variation in the interval between light emitting points due to thermal deformation in a multi-point light emitting laser diode having light emitting points arranged in close proximity to each other, and an optical disc apparatus provided with the semiconductor laser device.

BACKGROUND OF THE INVENTION

As a method for realizing high performance of an optical disc apparatus, signal processing of recording pits formed on a track on a disc is simultaneously performed, in parallel, for a plurality of tracks, and the processing speed is increased. In order to realize the same, development of an LD chip including a plurality of light emitting points which are separated from each other by separating grooves and independently driven in a single LD chip is advancing.

In addition, in order to realize a system in which immediately after a signal is recorded, the signal is reproduced and error checking is performed, it is necessary to constitute a two-point array in which a recording laser diode and a reproduction laser diode are arranged at two points in a line and they are controlled independently.

Conventionally, an LD chip provided with a linear array of multiple light emitting points with an interval of 50–100 μm on a same semiconductor substrate has been reported. In this system, however, Joule heat generated at an LD is conducted to an adjacent LD via the semiconductor substrate, whereby the light output is reduced, which phenomenon is called thermal crosstalk.

A solution to this problem is described, for example, in an article of "Hybrid laser array with closely spaced dual beams" in 35-th Applied Physics of Japan and Related Societies Meeting (1988 spring) Lecture Prescript pp. 898, 30p-ZQ-3.

This laser array with closely spaced dual beams has a structure in which two LD chips each having a single light emitting point are disposed on individual substrates functioning as a cooler and arranged with the light emitting points close to each other, in order to prevent thermal crosstalk.

FIG. 13 is a perspective view of this prior art laser array with closely spaced dual beams.

In FIG. 13, reference numeral 1 designates a stem. A high output laser diode (hereinafter referred to as high output LD) block for recording 2 is disposed on the stem 1. A high output LD submount 3 is mounted on the high output LD block 2. A high output LD chip 4 is mounted on the high output LD submount 3. A high output LD feeding wire 5 is connected to an electrode on the surface of the high output LD chip 4. Reference numeral 6 designates a light emitting point of the high output LD. A low noise LD block for reproduction 7 is disposed on the stem 1. A low noise LD submount 8 is mounted on the low noise LD block for reproduction 7. A low noise LD feeding wire 10 is connected to an electrode on the surface of the low noise LD chip 9. Reference numeral 11 designates a light emitting point of the low noise LD. Reference numeral 12 designates a lead.

In the laser array with closely spaced dual beams constructed as described above, the high output LD chip 4 and the low noise LD chip 9 are separately fixed to the high output LD block 2 and the low noise LD block 7 via the high output LD submount 3 and the low noise LD submount 8, respectively, and the LD chips 4 and 9 are fixed to the stem 1 by the high output LD block 2 and the low noise LD block 7, respectively, so that the light emitting point 6 of the single high output LD and the light emitting point 11 of the single low noise LD are opposed to each other with an interval of about 20 μm. Accordingly, the light emitting point 6 of the high output LD and the light emitting point 11 of the low noise LD can be spatially separated, thereby producing an advantage that thermal interference is not likely to occur.

In the laser array with closely spaced dual beams constructed as described above, when the temperature variation of the environment in which the LD array is employed is small, the above-described construction is thought to be sufficient. However, when the temperature variation of the environment is larger, the stem 1, the high output LD block 2, and the low noise LD block 7 change thermally and the interval between the light emitting point 6 of the high output LD and the light emitting point 11 of the low noise LD varies. For example, when the LD array is applied to an optical disc apparatus, the interval between the two light emitting points expands and contracts and, the deviation of the LD array from the optical system in the optical disc apparatus cannot be adjusted sufficiently only by the positional adjustment using the parallel movement of a semiconductor laser device to which the LD array is mounted. This presents preferable recording and reproduction.

SUMMARY OF THE INVENTION

It is an object of the present invention to provide a semiconductor laser device having less variation in the interval between the light emitting points due to the variation of the environmental temperature.

It is another object of the present invention to provide an optical disc apparatus that can perform preferable recording and reproduction even when it is affected significantly by variation of the environmental temperature by using the above-described semiconductor device.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser device includes: a substrate serving as a cooler; a thermal buffer plate disposed on the surface of the substrate; a first semiconductor laser chip having first and second main surfaces which includes a first light emitting point in the vicinity of the first main surface and is disposed on the surface of the thermal buffer plate via the second main surface; thermal conductors disposed on the first main surface of the first semiconductor laser chip with an interval from the first light emitting point so as to put the first light emitting point between them; a second semiconductor laser chip having third and fourth main surfaces which includes a second light emitting point in the vicinity of the third main surface and is disposed on the surface of the thermal conductor via the third main surface so that the light radiation direction of the laser chip is in parallel with the light radiation direction of the first semiconductor laser chip, wherein the second light emitting point is opposed to and close to the first light emitting point. Therefore, even when the environmental temperature changes, the expansion and contraction of the interval between the light emitting points can be reduced.

According to a second aspect of the present invention, in the above-described semiconductor laser device, first main electrodes are disposed on the first main surface of the first semiconductor laser chip and on the third main surface of the second semiconductor laser chip, respectively, via the thermal conductors comprising electrical conductors. Therefore, the first main electrodes of the first semiconductor laser chip and the second semiconductor laser chip are electrically connected with each other via the thermal conductors.

According to a third aspect of the present invention, in the above-described semiconductor laser device, a step is provided on one or both of the first main surface of the first semiconductor laser chip and the third main surface of the second semiconductor laser chip in the vicinity of the light emitting point, and the interval between the first main surface of the first semiconductor laser chip and the third main surface of the second semiconductor laser chip via the step is shorter than the height of the thermal conductor. Therefore, with keeping the height of the thermal conductor to a large value, the interval between the light emitting points can be reduced.

According to a fourth aspect of the present invention, in the above-described semiconductor laser device, a step is provided on one or both of the first main surface of the first semiconductor laser chip and the third main surface of the second semiconductor laser chip in the vicinity of the light emitting point, and the interval between the first main surface of the first semiconductor laser chip and the third main surface of the second semiconductor laser chip via the step is longer than the height of the thermal conductor. Therefore, with keeping the interval between the light emitting points at a required value, the height of the thermal conductor can be reduced.

According to a fifth aspect of the present invention, in the above-described semiconductor laser device, steps are provided at a portion of the first main surface of the first semiconductor laser chip and at a portion of the third main surface of the second semiconductor laser chip respectively so that the both steps are mutually engaged with each other, and the first light emitting point and the second light emitting point are arranged so that the steps are served as positioning means for opposing the first and second light emitting points with each other. Therefore, the first light emitting point and the second light emitting point can be opposed to each other with high precision.

According to a sixth aspect of the present invention, in the above-described semiconductor laser device, the steps of the first semiconductor laser chip and the second semiconductor laser chip respectively have a concave part or a convex part which are mutually engaged with each other, the light emitting points of the respective semiconductor laser chips are respectively disposed at the concave part and the convex part, insulating films are disposed at side surfaces of the convex part of the semiconductor laser chip having the convex part and at a portion other than the convex part of the first main surface or the third main surface, first main electrodes are disposed on the first main surface or the third main surface of the convex part and the insulating films, and thermal conductors are disposed on the first main electrodes on the insulating films. Therefore, the width of the concave part or convex part can be made wide.

According to a seventh aspect of the present invention, in the above-described semiconductor laser device, a plurality of first and second light emitting points are respectively disposed along the first main surface and the third main surface by using electrical separating means, and first main electrodes are individually provided on the respective first main surface or the respective third main surface corresponding to the respective light emitting points. Therefore, a plurality of light emitting points can be arranged in a row.

According to an eighth aspect of the present invention, an optical disc apparatus is provided with the above-described semiconductor laser device. Therefore, an optical disc apparatus which is not affected by the environmental temperature is obtained.

DESCRIPTION OF THE PREFERRED EMBODIMENTS

A description is given of a semiconductor laser device according to the present invention and an optical disc apparatus provided with the semiconductor laser device.

Figure 1:
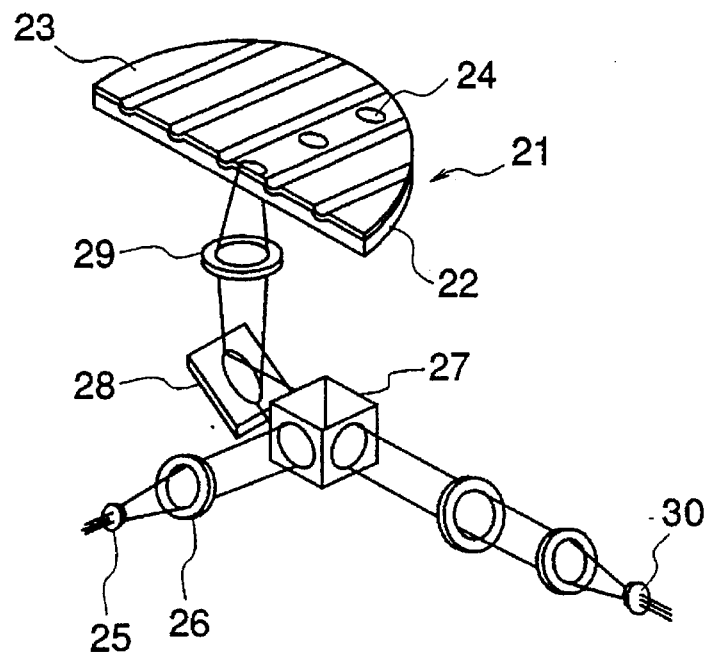
FIG. 1 is a perspective view illustrating an optical system of a general optical disc device.

FIG. 1 is a perspective view illustrating an optical system for a generalized optical disc apparatus. In FIG. 1, reference numeral 21 designates an optical disc. Numeral 22 designates a transparent disc substrate. Numeral 23 designates a recording film. Numeral 24 designates a recorded pit. Numeral 25 designates a semiconductor laser. Numeral 26 designates a collimating lens. Numeral 27 designates a beam splitter. Numeral 28 designates a mirror. Numeral 29 designates an objective lens. Numeral 30 designates an optical detector.

In FIG. 1, a recording film 23 of an opto-magnetic material as a recording material is formed on the transparent disc substrate 22. While recording information, employing the semiconductor laser 25 which is a high output LD, the laser beam output from the semiconductor laser 25 is made parallel by the collimating lens 26, passes through the beam splitter 27 and the mirror 28, and is focused by the objective lens 29, thereby forming the recording pit 24 on the recording film 23. While reproducing the recorded information, employing a low noise LD, the laser beam emitted from the low noise LD passes through the collimating lens 26, the beam splitter 27, and the mirror 28, and further the objective lens 29, and scans the track on the recording film 23 where the recording pit 24 is formed, and the brightness and darkness of the reflected laser beam is sent as a signal through the objective lens 29, the mirror 28, and the beam splitter 27 to the optical detector 30, to be read out.

Figure 2:
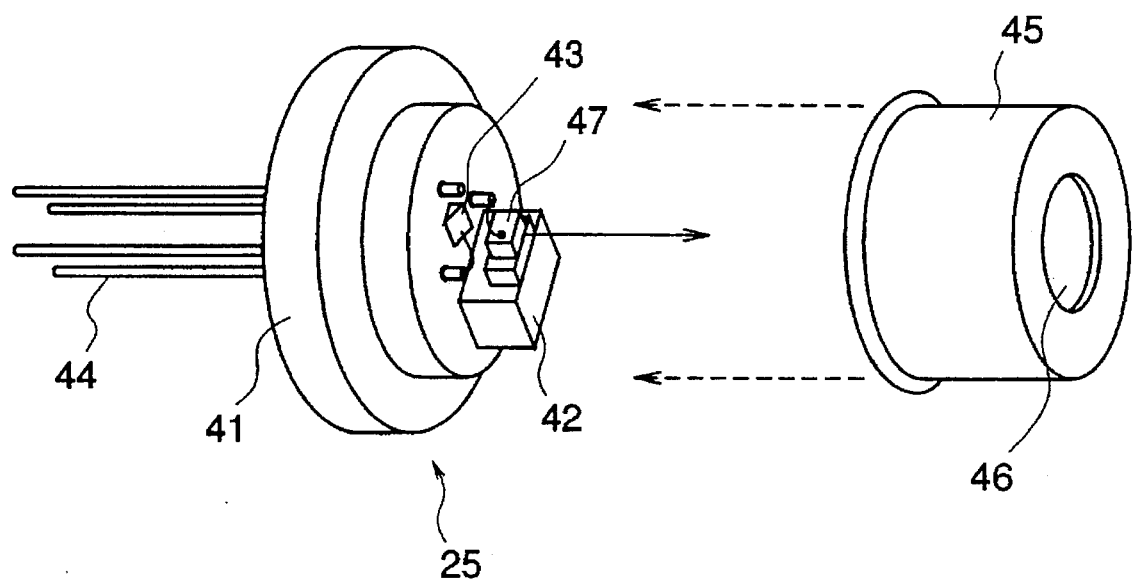
FIG. 2 is an exploded perspective view illustrating the general construction of a semiconductor laser.

FIG. 2 is an exploded perspective view illustrating a general construction of a semiconductor laser device. In FIG. 2, reference numeral 41 designates a stem. Numeral 42 designates a laser array. Numeral 43 designates a monitor photodiode array. Numeral 44 designates a lead. Numeral 45 designates a cap. Numeral 46 designates a glass window. Numeral 47 designates an LD.

To the laser array 42 adhered to the stem 41, electric power is supplied from the lead 44, and the laser beam is emitted from the LD 47 as shown by the solid arrow. The laser beam is also emitted from the LD 47 in the direction reverse to the solid arrow and, this laser beam is received by the monitor photodiode 43 and the output laser beam is emitted from the LD 47 while monitoring the light emission amount. The output laser beam is emitted through the glass window 46 of the cap 45 which protects the laser array 42 mounted to the stem 41. The inside of the cap 45 is normally filled with nitrogen.

Embodiment 1.

Figure 3:
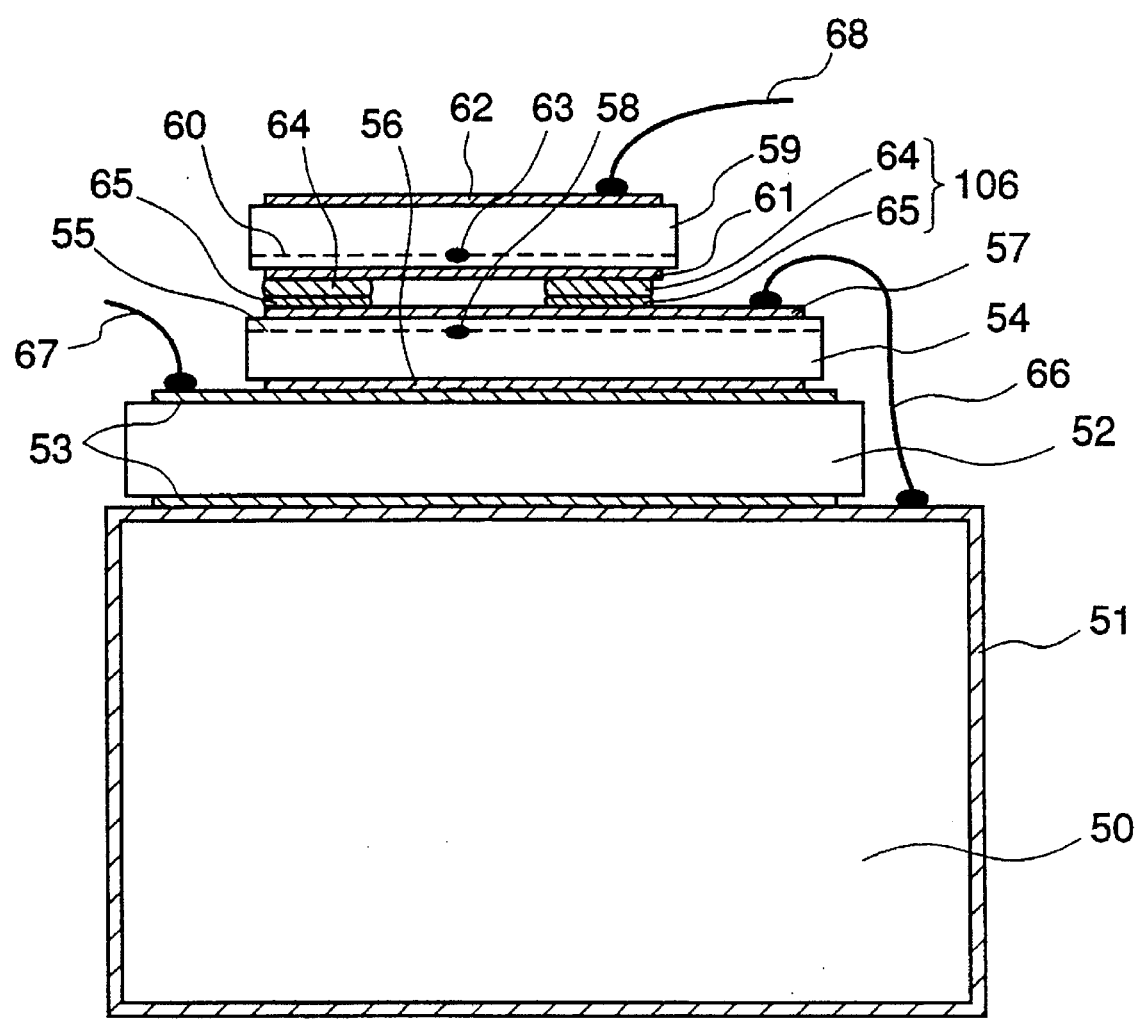
FIG. 3 is a plan view illustrating a semiconductor laser device according to a first embodiment of the present invention.

FIG. 3 is a plan view illustrating a semiconductor laser array according to a first embodiment of the present invention. As an example of the semiconductor laser array, a hybrid laser array with closely spaced dual beams is described. In addition, this hybrid laser array with closely spaced dual beams corresponds to a portion of the laser array 42 of the above-described semiconductor laser shown in FIG. 2.

In FIG. 3, reference numeral 50 designates a silver block functioning as a cooler. Numeral 51 designates a plated Au film on the surface of the silver block 50. Numeral 52 designates a submount comprising SiC as a thermal buffer plate disposed on the silver block 50. Numeral 53 designates a plated Sn film plated on the upper and lower surface of the submount 52. Numeral 54 designates a high output LD for recording as a first semiconductor laser chip. Numeral 55 designates a PN junction interface of the high output LD 54. Numeral 56 designates a P side electrode of the high output LD. Numeral 57 designates an N side electrode of the high output LD. Numeral 58 designates a light emitting point of the high output LD as a first light emitting point. Numeral 59 designates a low noise LD for reproduction as a second semiconductor laser chip. Numeral 60 designates a PN junction interface of the low noise LD. Numeral 61 designates an N side electrode of the low noise LD. Numeral 62 designates a P side electrode of the low noise LD. Numeral 63 designates a light emitting point of the low noise LD as a second light emitting point. Numeral 64 designates a plated Au film. Numeral 65 designates a plated Sn film. A heat conductive connecting leg 106 as a thermal conductor is constituted by the plated Au film 64 and the plated Sn film 65. Numeral 66 designates a minus side lead wire common for the high output LD and the low noise LD. Numeral 67 designates a plus side lead wire of the high output LD. Numeral 68 designates a plus side lead wire of the low noise LD. The electrodes of the LD comprise Au based alloy and gold is plated on the surface thereof.

To the silver block 50 having the plated Au film 51, the submount 52 having the plated Sn film 53 is adhered via AuSn alloy comprising the plated Au film 51 and the plated Sn film 53 which are pressure-welded. This submount 52 is provided for relaxing the thermal stress that is generated by the difference in the thermal expansion coefficients of the materials of the silver submount 50 and the high output LD. The P side electrode 56 of the high output LD 54 is adhered to the plated Sn film 53 of the submount 52.

The high output LD 54 and the low noise LD 59 are chips several hundreds of microns square. One PN junction interface 55 is close to the N side electrode 57 of the high output LD 54 and the light emitting point 58 of the high output LD is in this PN junction interface 55. The plated Sn film 65 is formed on the N side electrode 57 in a predetermined configuration including two parts with the light emitting point 58 of the high output LD 54 between them. The thickness of the plated Sn film 65 is normally on the order of several submicrons.

Also in the low noise LD 59, the PN junction interface 60 is close to the N side electrode 61 and the light emitting point 63 of the low noise LD is provided in this PN junction interface 60. The low noise LD 59 is disposed such that the N side electrode 61 is opposite the N side electrode 57 of the high output LD 54 and the light emitting point 63 of the low noise LD 59 is opposite the light emitting point 58 of the high output LD 54 with the N side electrode 61 and the N side electrode 57 between the light emitting points. Then, the high output LD 54 and the low noise LD 59 are disposed such that the plated Sn film 65 provided on the N side electrode 57 of the high output LD 54 and the plated Au film 64 3–5 μm thick formed on the N side electrode 61 of the low noise LD 59 before chip separation are in contact with each other. This plated Au film 64 and the plated Sn film 65 are alloyed when they are adhered with pressure during the fabrication process, thereby forming an AuSn alloy film and jointed to each other. The plated Au film 64 and the plated Sn film 65 junctioned by this AuSn alloy film become a heat conductive connecting leg 106 as a thermal conductor.

In addition, since the heat conductive connecting leg 106 comprises an electrical conductor, the N side electrode 57 of the high output LD 54 and the N side electrode 61 of the low noise LD 59 to create the same voltage, and these N side electrodes can be connected to the minus side lead wire 66 via a common terminal, resulting in shorter lead wires.

At the plus side, a plus side lead wire 67 of the high output LD is connected to the P side electrode 56 of the high output LD 54 and a plus side lead wire 68 of the low noise LD is connected to the P side electrode 62 of the low noise LD, whereby the high output LD 54 and the low noise LD 59 can be driven independently from each other.

A description is given of the operation.

When predetermined voltages are applied to the high output LD 54 and the low noise LD 59, respectively, and the LDs are driven, the light emitting points serve as heat sources which generate heat. Then, the heat generated at the light emitting point 58 of the high output LD 54 flows into the silver block 50 serving as a heatsink block via the submount 52 of SiC having a relatively good thermal conductivity, raising the temperature of the high output LD 54, thereby dissipating the heat to the outside and increasing the temperature of the silver block 50.

On the other hand, the heat generated at the light emitting point 63 of the low noise LD 59 flows into the high output LD 54 via the heat conductive connecting leg 106 connected by the AuSn alloy film, raising the temperature of the low noise LD 59, and heat, flows into the silver block 50 via the high output LD 54 and the submount 52.

When the LDs are driven, the light emitting point 58 of the high output LD 54 and the light emitting point 63 of the low noise LD 59 are opposed to each other with a space between them, whereby there arises less amount of thermal interference and no thermal crosstalk.

However, since the expansion and contraction of the space between the light emitting point 58 of the high output LD 54 and the light emitting point 63 of the low noise LD 59 while the LDs are driven corresponds to the thermal deformation of the heat conductive connecting leg 106, the plated Au film 64 is typically 3–5 μm thick and is at most several tens of μm, whereby the change in the spacing between the light emitting points is quite small even if it is summed with the plated Sn film 65.

On the other hand, as to thermal deformation due to a change in the environmental temperature, two kinds of thermal deformation should be considered.

The first one is a change in the interval between the light emitting points (hereinafter referred to as light emitting point interval) due to a change in the environmental temperature. Since it is thought that the change itself in the environmental temperature in the vicinity of the heat conductive connecting leg 106 is approximately equal to or less than the temperature change due to the thermal output power of the light emitting point, the variation in the light emitting point due to a change in the environmental temperature is thought to be approximately equal to or less than the variation in the light emitting point interval due to the thermal output power of the light emitting point, which is not so large.

The second thermal is due to a change in the environmental temperature of the silver block 50 and the submount 52. This thermal deformation may also include the stem 41 of FIG. 2 and this thermal deformation becomes considerably large because the sizes of the silver block 50 and the submount 52 become fairly large relative to the height of the conductive connecting leg 106. However, since this deformation produces parallel movement while maintaining the same light emitting point interval, the deviation of the parallel movement can be corrected easily by controlling the setting position of the semiconductor laser while using a semiconductor laser, for example, by the tracking mechanism in an optical disk apparatus.

While in the first embodiment, the submount 52 comprises an insulator, the submount 52 may comprise a conductor and an insulator may be inserted between the submount 52 and the silver block 50 or the silver block 50 may comprise an insulator with good heat conductivity.

In addition, in the first embodiment the high output LD 54 is adhered to the submount 52 and the low noise LD 59 is adhered thereto via heat conductive connecting leg 106 comprising the plated Au film 64 and the plated Sn film 65, the low noise LD 59 may be adhered to the submount 52 and the high output LD 54 may be adhered to the low noise LD 59 via this heat conductive connecting leg 106.

A description is given of a method of fabricating a semiconductor laser device according to the first embodiment.

Figure 4:
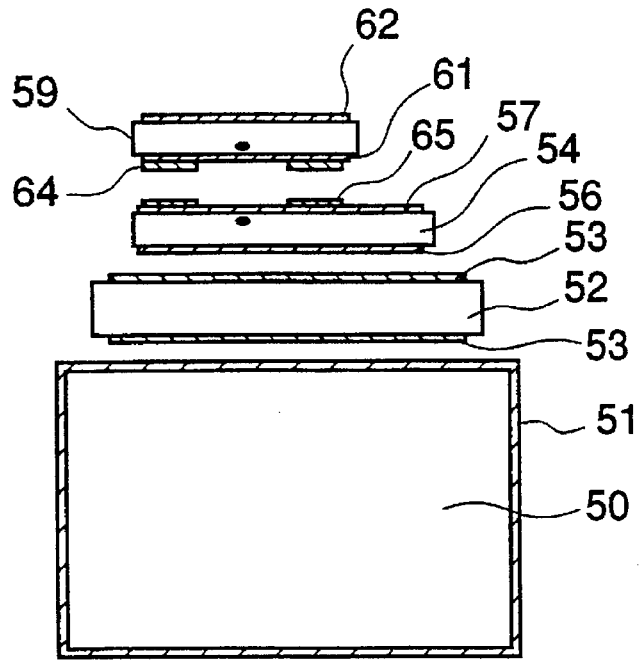
FIG. 4 is a sectional view illustrating a laser array fabricating process according to the first embodiment of the invention.
Figure 5:
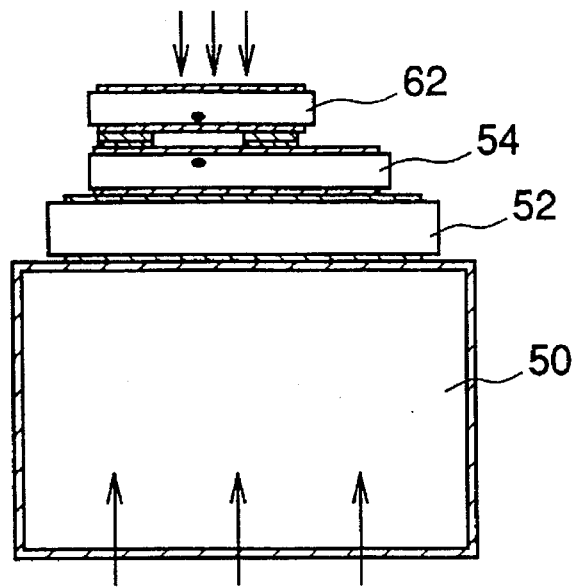
FIG. 5 is a sectional view illustrating a laser array fabricating process according to the first embodiment of the invention.
Figure 6:
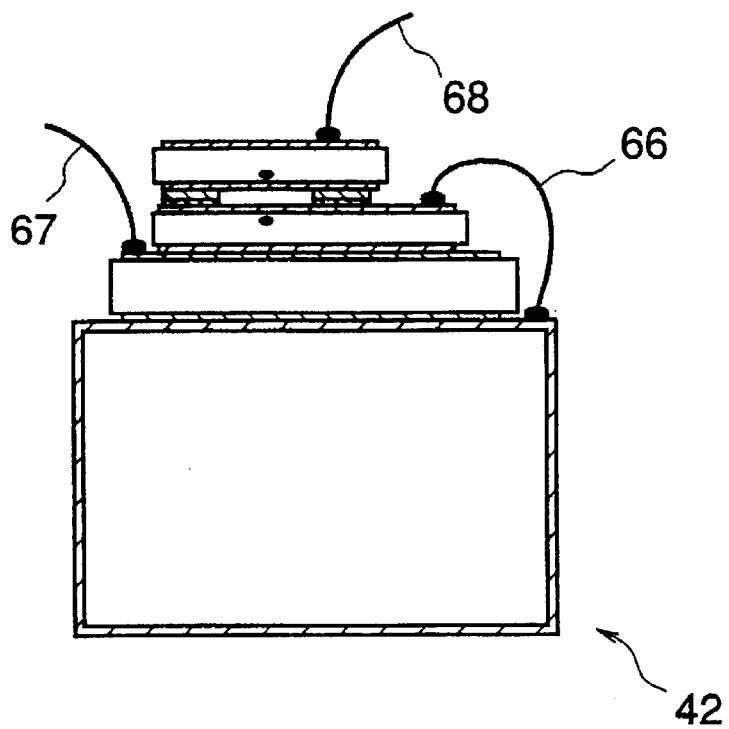
FIG. 6 is a sectional view illustrating a laser array fabricating process according to the first embodiment of the invention.
Figure 7:
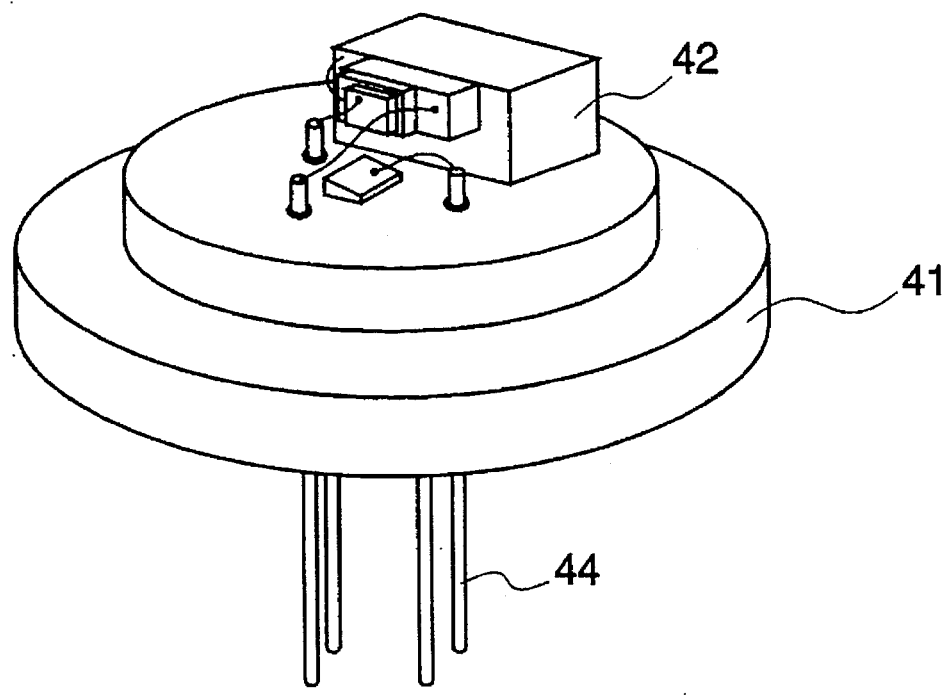
FIG. 7 is a perspective view illustrating the semiconductor laser mounting process according to the first embodiment of the invention.

FIGS. 4 to 6 are cross-sectional views of the laser array 42 in respective process steps in the method of fabricating the semiconductor laser device according to the first embodiment. FIG. 7 is a perspective view illustrating a semiconductor laser in a process of mounting the laser array 42 according to the first embodiment of the invention.

First of all, as shown in FIG. 4, prepared constituents before the mounting process are the silver block 50 on which the plated Au film 51 is formed, the submount 52 on which the plated Sn film 53 is formed, the high output LD 54 in which the P side electrode 56 and the N side electrode 57 are formed on the surfaces and the plated Sn film 65 is formed on the surface of the N side electrode 57 so as to put the light emitting point 58 between them, and the low noise LD 59 in which the P side electrode 62 and the N side electrode 61 are formed on the surfaces and the plated Au film 64 is formed on the surface of the N side electrode 61 so as to put the light emitting point 63 between them. The submount 52, the high output LD 54, and the low noise LD 59 are successively laminated. The high output LD 54 and the low output LD 59 are laminated with the light emitting point 58 and the light emitting point 63 opposed to each other via respective N side electrodes and with the plated Au film 64 placed on the plated Sn film 65.

Next, a weight is applied to the constituents of the laminated laser array in the direction of the arrow shown in FIG. 5 while heating the same at a temperature from 300° to 400° C., and the AuSn alloying is performed between the silver block 50 and the submount 52, between the submount 52 and the P side electrode 56 of the high output LD 54, and between the plated Sn film 65 and the plated Au film 64 to adhere them with each other.

Next, as shown in FIG. 6, the plus side lead wire 68 is wire-bonded to the P side electrode 62 of the low noise LD 59, the plus side lead wire 67 is wire-bonded to the P side electrode 56 of the high output LD 54, and the minus side lead wire 66 is wire-bonded between the N side electrode 57 of the high output LD 54 and the plated Au film 51 of the silver block 50, thereby completing a laser array 42.

Next, as shown in FIG. 7, the laser array 42 is mounted on the stem 41 and is connected to the lead 44. Further, though not shown in the figure, a cap is attached filled with nitrogen, and sealed, thereby completing a semiconductor laser.

Embodiment 2.

Figure 8:
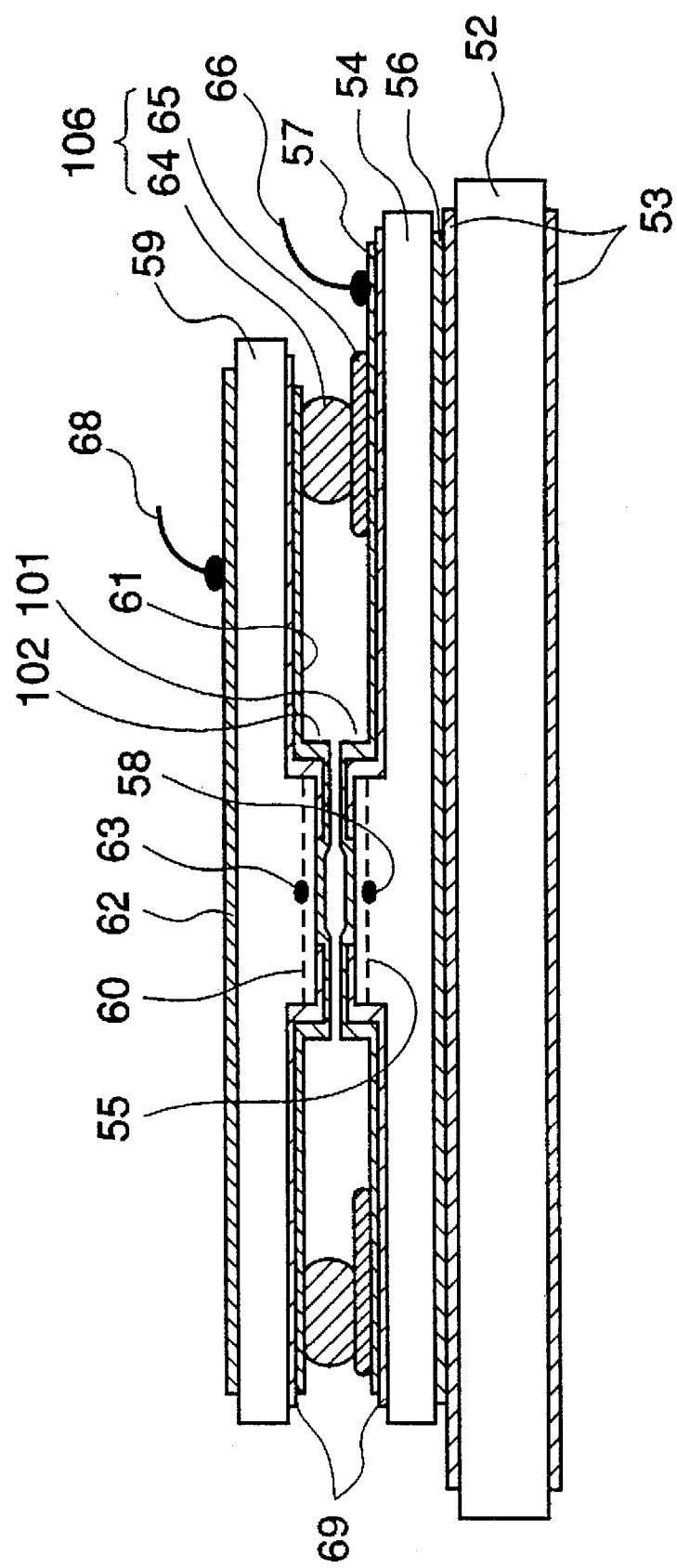
FIG. 8 is a plan view illustrating a semiconductor laser device according to a second embodiment of the present invention.

FIG. 8 is a plan view illustrating a laser array according to a second embodiment of the present invention. In FIG. 8, the high output LD 54 and the low noise LD 59 have convex steps 101 and 102 at the sides of the N side electrode 57 and the N side electrode 61, respectively. At the step 101 and the step 102, the PN junction interface 55 and the PN junction interface 60, and the light emitting point 58 and the light emitting point 63 are respectively provided, the light emitting point 58 and the light emitting point 63 are arranged close to each other, and the interval between the surfaces of the N side electrodes at this step smaller than the height of the heat conductive connecting leg 106 comprising the plated Au film 64 and the plated Sn film 65. The $SiO_2$ films 69 are formed on the N side electrode 57 of the high output LD 54 and the N side electrode 61 of the low noise LD 59 except for the vicinity of the light emitting point 58 and the light emitting point 63 in order to prevent short-circuiting between the P side electrode 56 and the N side electrode 57 and between the P side electrode 62 and the N side electrode 61.

The submount 52 is disposed on the silver block 50 as in the first embodiment. In addition, the P side electrode 56 of the high output LD is connected to the plus side lead wire 67 of the high output LD which is not shown in the figure.

While maintaining the light emitting point interval that is required for the laser array 42, the height of the heat conductive connecting leg 106 can be made high, for example, 10 μm–several tens of μm, or more, and high precision control can be easily achieved in the formation of the plated Au film 64 and the plated Sn film 65, and the light emitting point interval can be secured with high precision. Consequently, the yield of the product can be increased.

In addition, relative to a case where there is no step, since the portions where the N side electrode 57 of the high output LD 54 and the N side electrode 61 of the low noise LD 59 are opposed to each other is only in the vicinity of the light emitting points, the precision that is required for the degree of parallelization between the surface of the N side electrode 57 of the high output LD 54 and the surface of the N side electrode 61 of the low noise LD 59 is relaxed, whereby the distance between a N side electrodes can be narrowed and the laser array having a small light emitting point interval can be made. The laser array having a small light emitting interval can avoid the spherical surface astigmatism of a lens used in a semiconductor laser.

In this embodiment, although both of the high output LD 54 and the low noise LD 59 include raised, i.e., portions, only one of the LDs may be provided with a convex part with the same effects as described above.

Embodiment 3.

Figure 9:
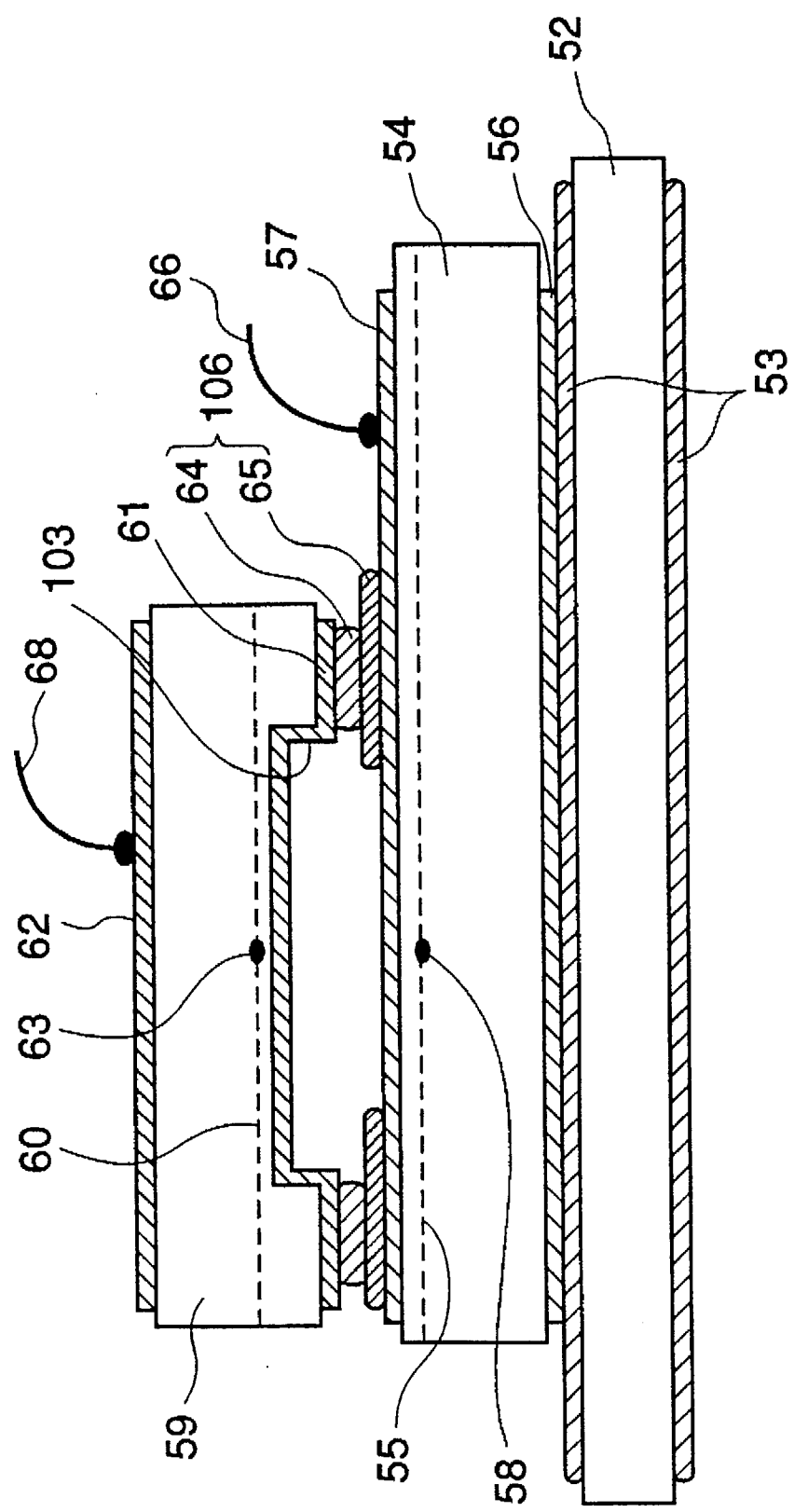
FIG. 9 is a plan view illustrating a semiconductor laser device according to a third embodiment of the present invention.

FIG. 9 is a plan view illustrating a laser array according to a third embodiment of the present invention. In FIG. 9, the low noise LD 59 has a concave step 103 at the side of the N side electrode 61. In the vicinity of the N side electrode 61 in the step 103, the light emitting point 63 is provided.

The submount 52 is disposed on the silver block 50 as in the first embodiment. Further, the P side electrode 56 of the high output LD is connected with the plus side lead wire 67 of the high output LD which is not shown in the figure.

By such a construction, securing the interval between the light emitting point 58 and the light emitting point 63 at a required dimension, the heat conductive connecting leg 106 can be formed with the height of the plated Au film 64 being extremely thin.

Since one of the factors affecting the light emitting point interval is thermal deformation of the heat conductive connecting leg 106 in the height direction, by reducing the height of the plated Au film 64 in order to reduce the height of the heat conductive connecting leg 106, the thermal deformation of the heat conductive connecting leg 106 can be reduced and the thermal deformation of the light emitting point interval can be reduced.

In addition, in the fabricating process of the laser array 42, if the plated Au film 64 is made thin during plating, variations in the height due to plastic deformation of the plated Au film 64, which is relatively weak, when the laser array device is heat-welded can be reduced.

In other words, the surface of the chip itself and the plated Sn film 65 are finished at a high processing precision, and they are unlikely to be deformed because they comprise a material of sufficient hardness. Therefore, since the variations in the height of the plated Au film 64 due to the applied pressure when the film is heat-welded determine the dimensional precision of the light emitting point interval, by making the plated Au film 64 as thin as the surface waviness or surface roughness, for example, 1 μm or less, variations in the height due to plastic deformation can be reduced, whereby unstable dimensional precision of the light emitting point interval in the heat-welding process can be avoided.

While in the third embodiment a concave part is provided at one of the LDs, concave parts may be provided at the both of the LDs with the same effects as described above.

Embodiment 4.

Figure 10:
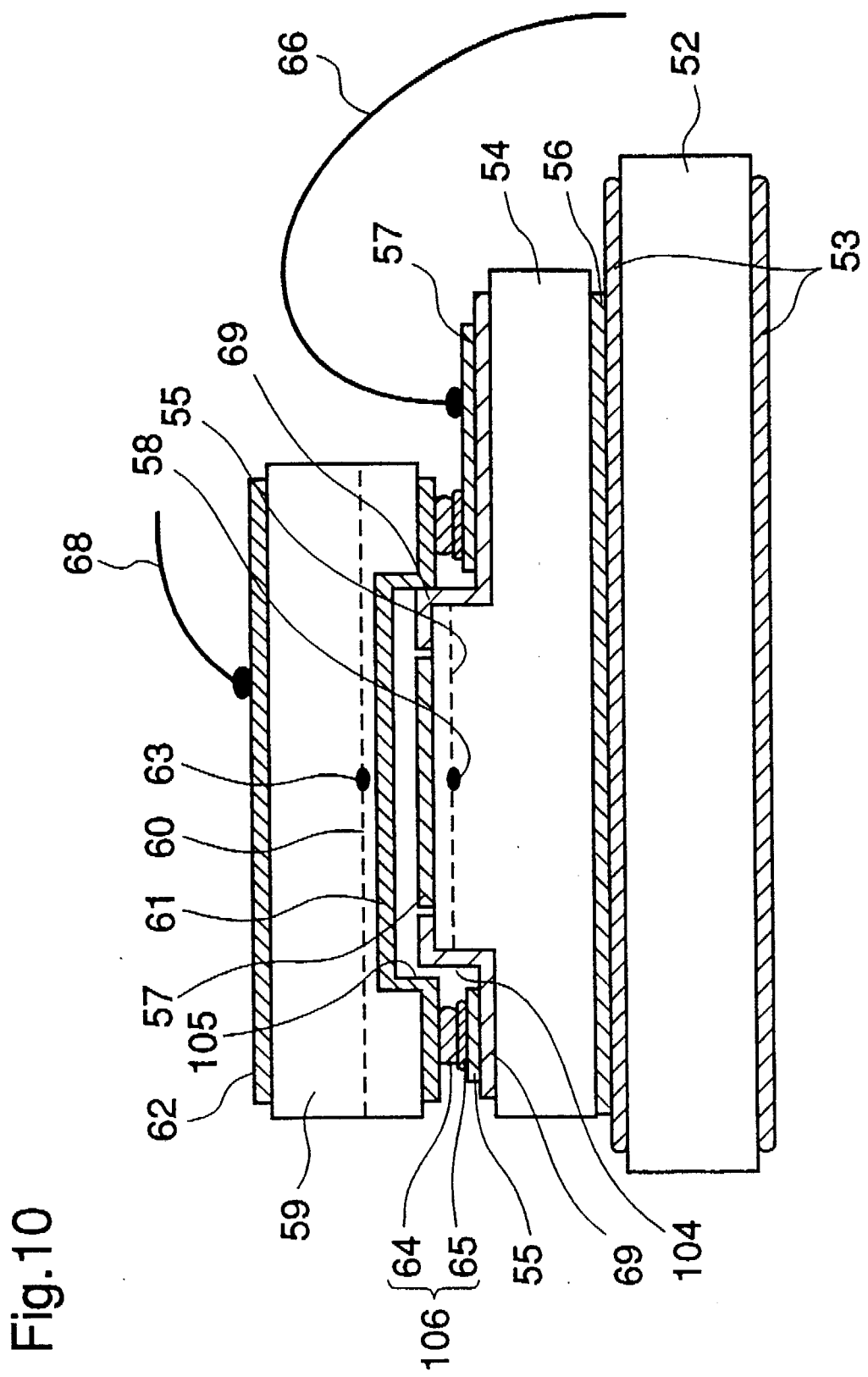
FIG. 10 is a plan view illustrating a semiconductor laser device according to a fourth embodiment of the present invention.

FIG. 10 is a plan view illustrating a laser array according to a fourth embodiment of the present invention. In FIG. 10, at the side of the N side electrode 57 of the high output LD 54, a convex step 104 is provided, and at the side of the N side electrode 61 of the low noise LD 59, a concave step 105 is provided. The PN junction interface 55 is provided at the step 104 and the PN junction interface 60, the light emitting point 58 and the light emitting point 63 are all provided in the vicinity of the step 106. The portion of the high output LD 54 at the side of the N side electrode 57 of the high output LD 54 is formed via the SiO$_2$ film 69 except for the vicinity of the light emitting point 58 in order to avoid short-circuiting with the P side electrode 56. Accordingly, the SiO$_2$ film 69 is also formed at the side wall of the step 104.

The N side electrode 57 in the vicinity of the light emitting point 58 and the N side electrode 57 provided on the SiO$_2$ film 69 in the vicinity of the heat conductive connecting leg 106 are electrically connected with each other, though not shown in FIG. 10.

The step 104 and the step 105 are engaged with each other, and when the high output LD 54 and the low noise LD 59 are moved relatively in the transverse direction, the sidewall of the convex step 104 and the side wall of the concave step 105 contact each other.

The submount 52 is disposed on the silver block 50 as in the first embodiment. In addition, the P side electrode 56 of the high output LD is connected with a plus side lead wire 67 of the high output LD that is not shown in the figure.

By adopting such a structure, if the distance between the light emitting point 58 of the high output LD 54 and the sidewall of the convex step 104 coincides with the distance between the light emitting point 63 of the low noise LD 59 and the sidewall of the concave step 105, when the parts are laminated in fabricating the laser array 42, positioning is performed by contacting the sidewall of the convex step 104 and the sidewall of the concave step 105, whereby the light emitting point 58 and the light emitting point 63 can be opposed to each other correctly via the respective N side electrodes, and a laser array having a high positional precision of the light emitting point can be obtained in a simple process.

While in the fourth embodiment, the convex step 104 is provided at the side of the N side electrode 57 of the high output LD 54 and the concave step 105 is provided at the side of the N side electrode 61 of the low noise LD 59, the concave step may be provided at the side of the N side electrode 57 of the high output LD 54 and the convex step may be provided at the side of the N side electrode 61 of the low noise LD 59.

While in the fourth embodiment the convex part and the concave part are combined, the steps of the step-like configuration may be combined with the same effect as described above.

In addition, the interval between the N side electrode 57 of the convex step 104 and the N side electrode 61 of the concave step 105 may be made different from the height of the heat conductive connecting leg 106, with the same effects as in the second and third embodiments.

Where the convex part and the concave part are combined, a silicon dioxide film is formed at the side of the N side electrode of the high output LD except for the vicinity of the light emitting point to prevent short-circuiting with the P side electrode. In any of cases where convex parts are provided at both the high output and the low noise LD, where a convex part is provided only at one of the LDs, where concave parts are provided at both the high output LD and the low output LD, and where a concave part is provided only at one of the LDs, a silicon dioxide film may be provided except for the vicinity of the light emitting point, with the effect of preventing short-circuiting between the N side electrode and the P side electrode as in the present embodiment.

Embodiment 5.

Figure 11:
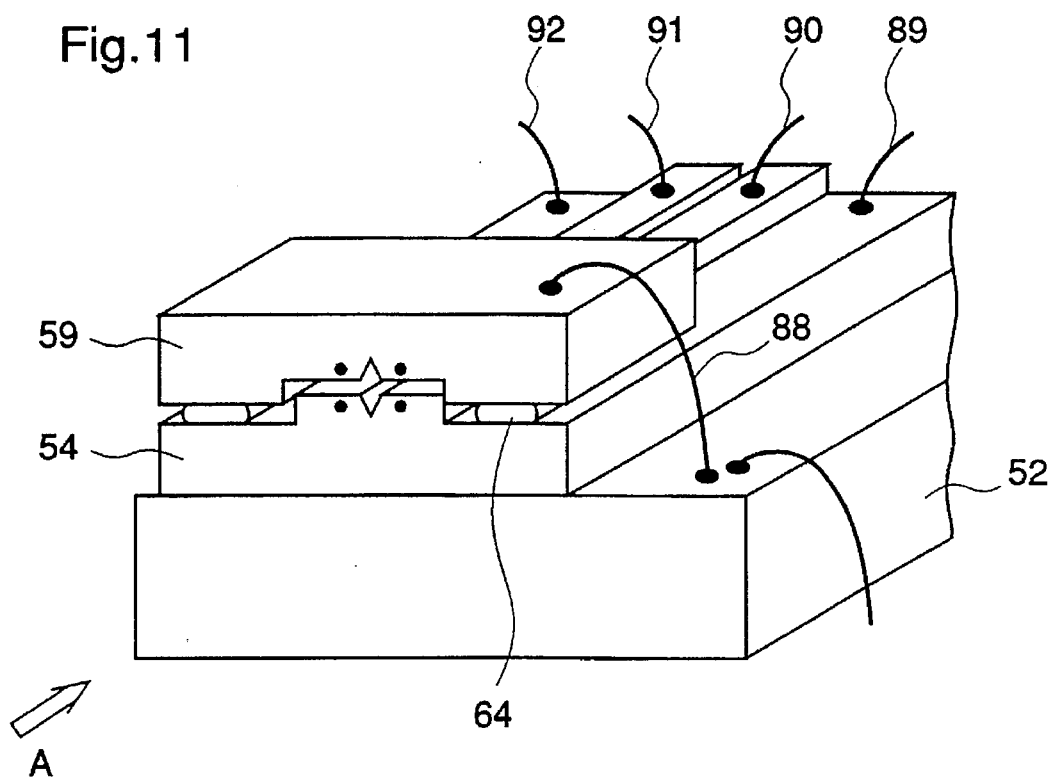
FIG. 11 is a partial perspective view illustrating a semiconductor laser device according to a fifth embodiment of the present invention.
Figure 12:
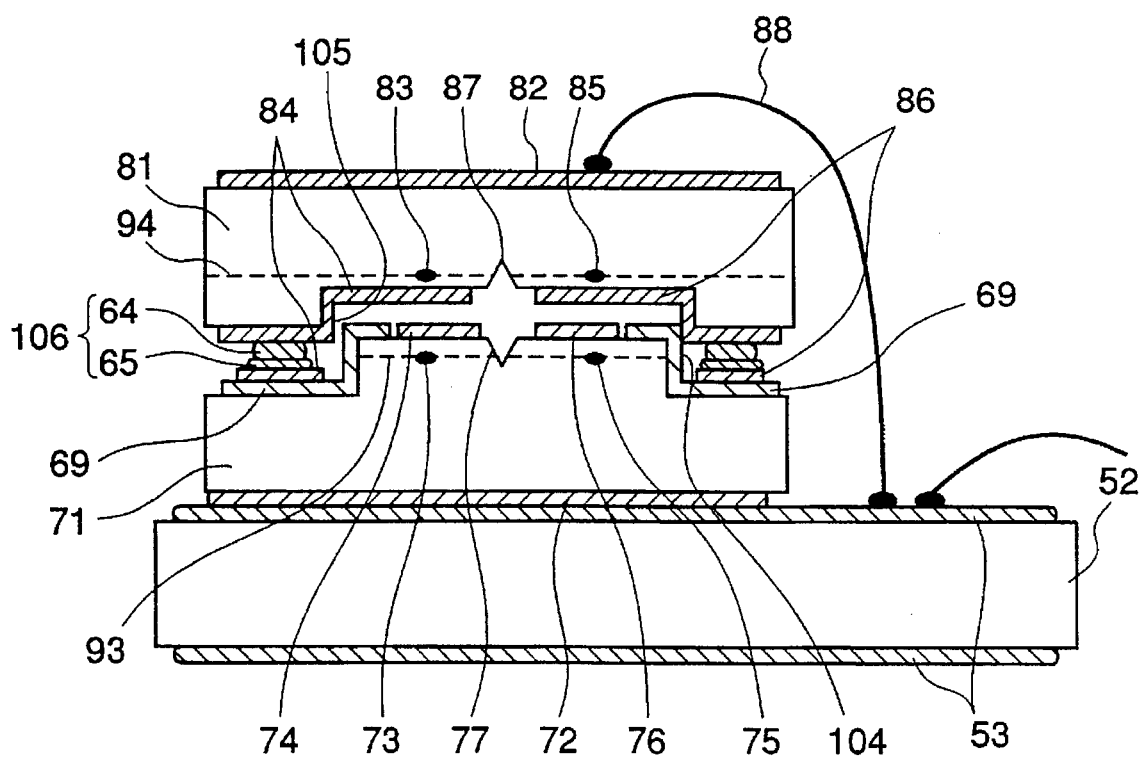
FIG. 12 is a plan view illustrating the semiconductor laser device according to the fifth embodiment of the invention viewed from the arrow A in FIG. 11.
Figure 13:
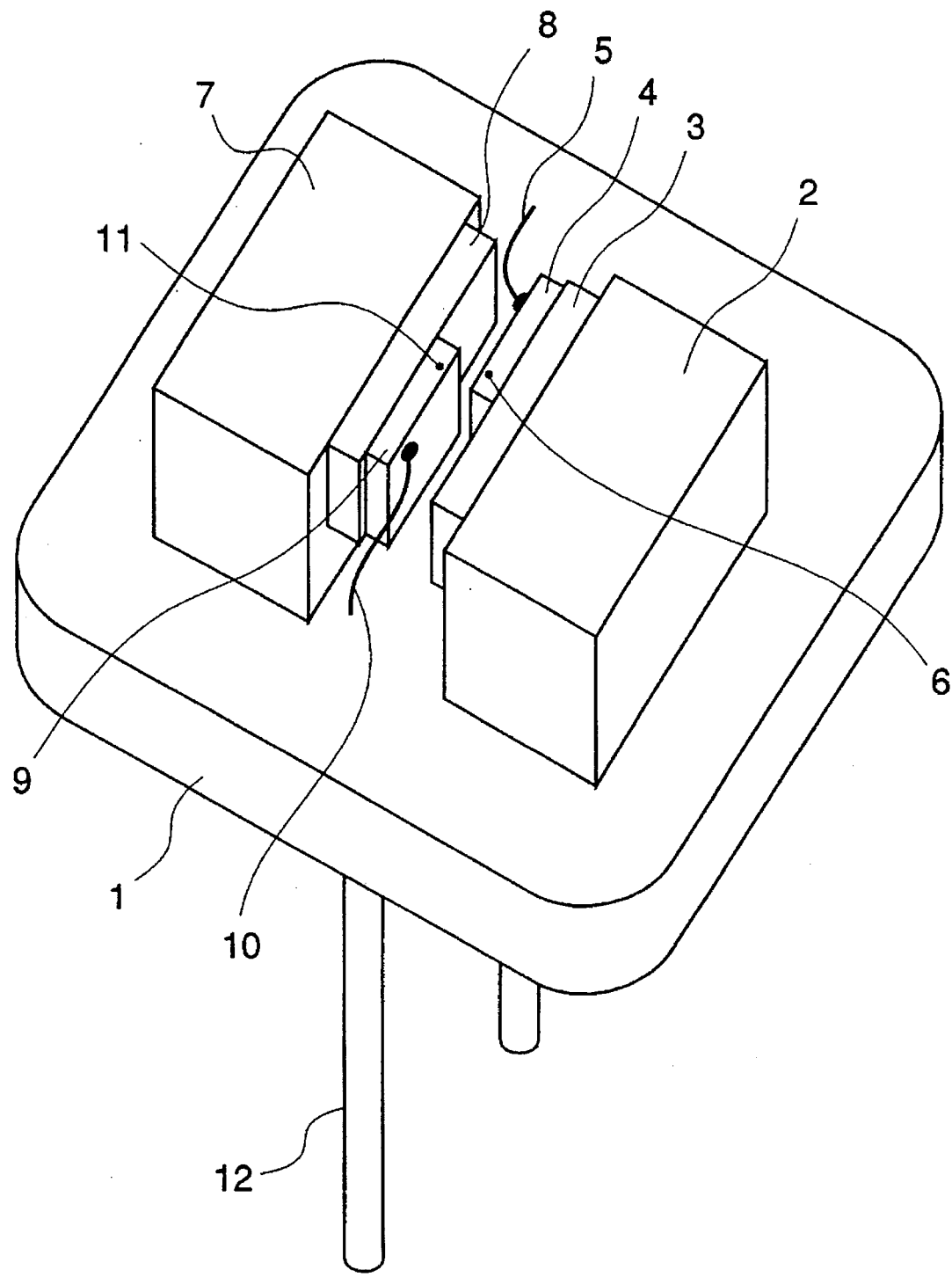
FIG. 13 is a perspective view illustrating a prior art laser array with closely spaced dual beams.

FIG. 11 is a partial perspective view illustrating a laser array according to a fifth embodiment of the present invention. FIG. 12 is a plan view illustrating a laser array viewed along the arrow A of FIG. 11.

The laser array according to the fifth embodiment includes laser chips each having a plurality of light emitting points opposed to each other. A device in which the laser chips have two light emitting points each will be described.

In FIG. 12, numeral 71 designates a high output LD, numeral 72 designates an N side common electrode of the high output LD 71, and numeral 73 designates a first light emitting point of the high output LD 71. Numeral 74 designates a first P side electrode of the high output LD 71, numeral 75 designates a second light emitting point of the high output LD 71, and numeral 76 designates a second P side electrode of the high output LD 71. Numeral 77 designates a separating groove as a means for electrically separating the laser at the side of the first light emitting point 73 from the laser at the side of the second light emitting point 75. Numeral 81 designates a low noise LD, numeral 82 designates an N side common electrode of the low noise LD 81, and numeral 83 designates a first light emitting point of the low noise LD 81. Numeral 84 designates a first P side electrode of the low noise LD 81, numeral 85 designates a second light emitting point of the low noise LD 81, and numeral 86 designates a second P side electrode of the low noise LD 81. Numeral 87 designates a separating groove as a means for electrically separating the laser at the side of the first light emitting point 83 from the laser at the side of the second light emitting point 85. Numeral 88 designates a minus side lead wire connecting the N side common electrode 72 of the high output LD 71 and the N side common electrode 82 of the low noise LD 81. In FIG. 11, numeral 89 designates a plus side lead wire for applying a plus voltage to the second light emitting point 85 of the low noise LD 81 and, although not shown in FIG. 11, this plus side lead wire 89 applies a plus voltage to the second P side electrode 86 of the low noise LD 81 through the P side electrode 86 which is disposed on the high output LD 71 via the SiO₂ film 69 and the heat conductive connecting leg 106 comprising the plated Sn film 65 and the plated Au film 64.

In FIG. 11, numeral 90 designates a plus side lead wire for applying a plus voltage to the second P side electrode 76 of the high output LD 71, and this is connected to the second P side electrode 76 shown in FIG. 12. Numeral 91 designates a plus side lead wire for applying a plus voltage to the first P side electrode 74 of the high output LD 71, and this is connected to the second P side electrode 74 shown in FIG. 12.

In FIG. 11, numeral 92 designates a plus side lead wire for applying a plus voltage to the first light emitting point 83 of the low noise LD 81. The plus side lead wire 92 applies a voltage to the first P side electrode 84 of the low noise LD 81 through the first P side electrode 84 disposed on the high output LD 71 via the SiO₂ film 69 and the heat conductive connecting leg 106, which is only shown in FIG. 12. In FIG. 12, numeral 93 designates a PN junction interface of the high output LD 71, numeral 94 designates a PN junction interface of the low noise LD 81, numeral 104 designates a convex step provided at the side of the P side electrode 74 and the P side electrode 76 of the high output LD 71, and numeral 105 designates a concave step provided at the side of the P side electrode 84 and the P side electrode 86 of the low noise LD 81.

The separating grooves 77 and 87 are formed in the same chip and having depths exceeding the depths of the respective PN junction interfaces from the chip surface for electrical separation of the driving the lasers. Except for such configurational separation, an insulator may be provided between the lasers.

The submount 52 may be disposed on the silver block 50 as in the first embodiment.

When a minus voltage is applied to the N side common electrode 72 of the high output LD 71 and the N side common electrode 82 of the low noise LD 81 by the minus side lead wire 88 and a predetermined plus voltage is applied to the first P side electrode 74 and the second P side electrode 76 of the high output LD 71 and also to the first P side electrode 84 and the second P side electrode 86 of the low noise LD 81, respectively, the lasers corresponding to the respective P side electrodes independently oscillate to emit light.

The heat generated at the light emitting point flows into the silver block 50 as in the first embodiment and is dispersed from this silver block 50.

By this construction, a multi-point linear array with closely spaced dual beams that has less thermal crosstalk and is unlikely to be affected in its light emitting point interval by thermal influences is formed in a simple construction.

In addition, the step 104 and the step 105 are positioned such that the sidewall of the convex step 104 and the sidewall of the concave step 105 are in contact with each other as in the fourth embodiment, whereby the light emitting point 73 and the light emitting point 83 can be precisely opposed to each other and a laser array having a high positional precision of the light emitting point can be obtained in a simple process.

Further, the interval between the P side electrode at the side of the convex step 104 and the P side electrode at the side of the concave step 105 can be made different from the height of the heat conductive connecting leg 106, with the same effects as in the second and the third embodiments.

In addition, in the fifth embodiment, a convex step is provided at the side of the N side electrode of the high output LD and a concave step is provided at the side of the low noise LD. Where convex parts are provided at both of the high output LD and the low noise LD, where a convex part is provided only at one of the LDs, where concave parts are provided at both of the high output LD and the low noise LD, and where a concave part is provided only at one of the LDs, a plurality of light emitting points may be provided in the respective laser chips that are arranged close to each other, with the same effects as in the above-described embodiment.

Embodiment 6.

The laser array with closely spaced dual beams described in the first to fifth embodiments can be used as a semiconductor laser of the optical disc apparatus.

In the optical disc apparatus according to the sixth embodiment, the interval between the light emitting point of the high output LD for recording and the light emitting point of the low noise LD for reproducing are not so greatly influenced by the environmental temperature. Accordingly, even when the environmental temperature changes a lot when recording and reproduction are performed at the same time, the light emitting point interval of the semiconductor laser does not change and the light emitting points move in parallel with each other. Therefore, it is possible to construct an optical disc apparatus that can prevent a malfunction during the recording and reproduction by controlling the position of the semiconductor laser device using a trucking mechanism.

What is claimed is:

1. A semiconductor laser device comprising:

a substrate serving as a heat sink and having a surface;

a thermal buffer plate disposed on the substrate;

a first semiconductor laser chip having a first main surface and a second main surface which are opposed to each other and arranged in parallel with a light radiation direction of the first semiconductor laser chip, the first semiconductor laser chip including a first light emitting point proximate the first main surface and being disposed on the thermal buffer plate at the second main surface;

a pair of spaced apart thermal conductors disposed on the first main surface of the first semiconductor laser chip with the first light emitting point between the thermal conductors;

a second semiconductor laser chip having a third main surface and a fourth main surface which are opposed to each other and arranged in parallel with a light radiation direction of the second semiconductor laser chip, the second semiconductor laser chip including a second light emitting point proximate the third main surface and being disposed on the thermal conductors at the third main surface so that the light radiation direction of the second semiconductor laser chip is parallel to the light radiation direction of the first semiconductor laser chip, wherein the second light emitting point is opposite and close to the first light emitting point and the thermal conductors have a height between the first and third main surfaces.

2. The semiconductor laser device of claim 1 wherein first main electrodes are disposed on the first main surface of the first semiconductor laser chip and on the third main surface of the second semiconductor laser chip, respectively, and connected to the thermal conductors which comprise electrical conductors.

3. The semiconductor laser device of claim 1 wherein a step is provided on at least one of the first main surface of the first semiconductor laser chip and the third main surface of the second semiconductor laser chip proximate the light emitting point, and the first main surface of the first semiconductor laser chip is separated from the third main surface of the second semiconductor laser chip at the step by a distance shorter than the height of the thermal conductors.

4. The semiconductor laser device of claim 2 wherein a step is provided on at least one of the first main surface of the first semiconductor laser chip and the third main surface of the second semiconductor laser chip proximate the light emitting point, and the first main surface of the first semiconductor laser chip is separated from the third main surface of the second semiconductor laser chip at the step by a distance shorter than the height of the thermal conductors.

5. The semiconductor laser device of claim 1 wherein a step is provided on at least one of the first main surface of the first semiconductor laser chip and the third main surface of the second semiconductor laser chip in the vicinity of the light emitting point, and the first main surface of the first semiconductor laser chip is separated from the third main surface of the second semiconductor laser chip at the step by a distance longer than the height of the thermal conductor.

6. The semiconductor laser device of claim 2 wherein a step is provided on at least one of the first main surface of the first semiconductor laser chip and the third main surface of the second semiconductor laser chip in the vicinity of the light emitting point, and the first main surface of the first semiconductor laser chip is separated from the third main surface of the second semiconductor laser chip at the step by a distance longer than the height of the thermal conductor.

7. The semiconductor laser device of claim 1 wherein steps are provided at a portion of the first main surface of the first semiconductor laser chip and at a portion of the third main surface of the second semiconductor laser chip respectively so that the steps mutually engage each other, and the first light emitting point and the second light emitting point are arranged so that the steps position the first and second light emitting points with respect to each other.

8. The semiconductor laser device of claim 2 wherein steps are provided at a portion of the first main surface of the first semiconductor laser chip and at a portion of the third main surface of the second semiconductor laser chip respectively, so that the steps mutually engage each other, and the first light emitting point and the second light emitting point are arranged so that the steps position the first and second light emitting points with respect to each other.

9. The semiconductor laser device of claim 7 wherein steps of the first semiconductor laser chip and the second semiconductor laser chip include complementary concave and convex parts that are mutually engaged with each other, the light emitting points of the respective semiconductor laser chips are respectively disposed at concave and convex parts, insulating films are disposed at side surfaces of the convex part and other than the convex part, first main electrodes are disposed on the convex part and the insulating films, and the thermal conductors are disposed on the first main electrodes on the insulating films.

10. The semiconductor laser device of claim 8 wherein steps of the first semiconductor laser chip and the second semiconductor laser chip include complementary concave and convex parts that are mutually engaged with each other, the light emitting points of the respective semiconductor laser chips are respectively disposed at concave and convex parts, insulating films are disposed at side surfaces of the convex part and other than the convex part, first main electrodes are disposed on the convex part and the insulating films, and the thermal conductors are disposed on the first main electrodes on the insulating films.

11. The semiconductor laser device of claim 9 including a plurality of first and second light emitting points respectively disposed proximate the first main surface and the third main surface, electrical separating means for mutually electrically isolating adjacent pairs of first and second light emitting points, respectively, and first main electrodes individually provided on the first main surface and the third main surface respectively corresponding to individual light emitting points.

12. The semiconductor laser device of claim 10 including a plurality of first and second light emitting points respectively disposed proximate the first main surface and the third main surface, electrical separating means for mutually electrically isolating adjacent pairs of first and second light emitting points, respectively, and first main electrodes individually provided on the first main surface and the third main surface respectively corresponding to individual light emitting points.

13. An optical disc apparatus including the semiconductor laser device according to claim 1.

14. The semiconductor laser device of claim 11 wherein the electrical separating means comprises a plurality of grooves in the first main surface and the third main surface.

15. The semiconductor laser device of claim 12 wherein the electrical separating means comprises a plurality of grooves in the first main surface and the third main surface.

* * * * *

UNITED STATES PATENT AND TRADEMARK OFFICE
CERTIFICATE OF CORRECTION

PATENT NO. : 5,638,391
DATED : June 10, 1997
INVENTOR(S) : Shima et al.

It is certified that error appears in the above-identified patent and that said Letters Patent is hereby corrected as shown below:

On the title page, item [54] and column 1, line 3, change "SEMICLONDUCTOR" to --SEMICONDUCTOR--.

Signed and Sealed this

Twenty-third Day of December, 1997

Attest:

Attesting Officer

BRUCE LEHMAN

Commissioner of Patents and Trademarks